United States Patent
De Payrebrune

(10) Patent No.: US 10,421,561 B2
(45) Date of Patent: Sep. 24, 2019

(54) POWER SUPPLY MODULE FOR SPACECRAFT

(71) Applicant: DPL SCIENCE INC., Saint-Lazare, Québec (CA)

(72) Inventor: Mark De Payrebrune, Saint-Lazare (CA)

(73) Assignee: DPL Science Inc., Montreal, Quebec (CA)

(*) Notice: Subject to any disclaimer, the term of this patent is extended or adjusted under 35 U.S.C. 154(b) by 0 days.

(21) Appl. No.: 15/758,882

(22) PCT Filed: Apr. 15, 2016

(86) PCT No.: PCT/CA2016/050441
§ 371 (c)(1),
(2) Date: Mar. 9, 2018

(87) PCT Pub. No.: WO2017/177301
PCT Pub. Date: Oct. 19, 2017

(65) Prior Publication Data
US 2018/0281994 A1    Oct. 4, 2018

(51) Int. Cl.
| | |
|---|---|
| *B64G 1/00* | (2006.01) |
| *B64G 1/44* | (2006.01) |
| *H02S 40/30* | (2014.01) |
| *H02S 40/44* | (2014.01) |
| *H02J 7/35* | (2006.01) |
| *B64G 1/42* | (2006.01) |
| *H02J 1/00* | (2006.01) |

(52) U.S. Cl.
CPC ............ *B64G 1/443* (2013.01); *B64G 1/428* (2013.01); *B64G 1/44* (2013.01); *H02J 1/00* (2013.01); *H02J 7/35* (2013.01); *H02S 40/30* (2014.12); *H02S 40/44* (2014.12); *B64G 1/425* (2013.01)

(58) Field of Classification Search
CPC ........... B64G 1/443; B64G 1/00; H01L 31/00; H02S 40/00; H02J 1/00; H02J 7/00
USPC ........................................ 307/9.1
See application file for complete search history.

(56) References Cited

U.S. PATENT DOCUMENTS

| | | | |
|---|---|---|---|
| 5,504,418 A | 4/1996 | Ashley | |
| 6,384,314 B1 * | 5/2002 | Lund-Hansen | E06B 9/386 126/621 |

(Continued)

FOREIGN PATENT DOCUMENTS

WO    20000074200    12/2000

OTHER PUBLICATIONS

On the control of photovoltaic maximum power point tracker via output parameters, IEE Proc.-Electr. Power Appl., vol. 152, No. 2, Mar. 2005.

(Continued)

*Primary Examiner* — Rexford N Barnie
*Assistant Examiner* — Joseph N Inge
(74) *Attorney, Agent, or Firm* — Kevin Pillay

(57) ABSTRACT

A power supply module for providing power to an unregulated spacecraft electrical power bus, the power supply module comprising a solar cell, output terminals, and a power converter mounted to the solar cell, the power converter providing converted power from the solar cell to the output terminal having a DC output voltage determined by a voltage of the unregulated spacecraft electrical power bus.

19 Claims, 12 Drawing Sheets

(56) References Cited

U.S. PATENT DOCUMENTS

| | | | | |
|---|---|---|---|---|
| 2002/0100841 A1* | 8/2002 | Decker | ................ | B64G 1/405 |
| | | | | 244/171.1 |
| 2004/0067796 A1* | 4/2004 | Murrey | ................ | A63D 15/00 |
| | | | | 473/4 |
| 2007/0024257 A1* | 2/2007 | Boldo | ...................... | G05F 1/67 |
| | | | | 323/282 |
| 2010/0008078 A1* | 1/2010 | Zhang | ..................... | F21S 8/085 |
| | | | | 362/183 |
| 2014/0167661 A1* | 6/2014 | van der Merwe | ........................... | |
| | | | | H02M 3/33507 |
| | | | | 318/400.3 |

OTHER PUBLICATIONS

Comparison of Photovoltaic Array Maximum Power Point Tracking Techniques, IEEE Transactions on Energy Conversion, vol. 22, No. 2, Jun. 2007.

\* cited by examiner

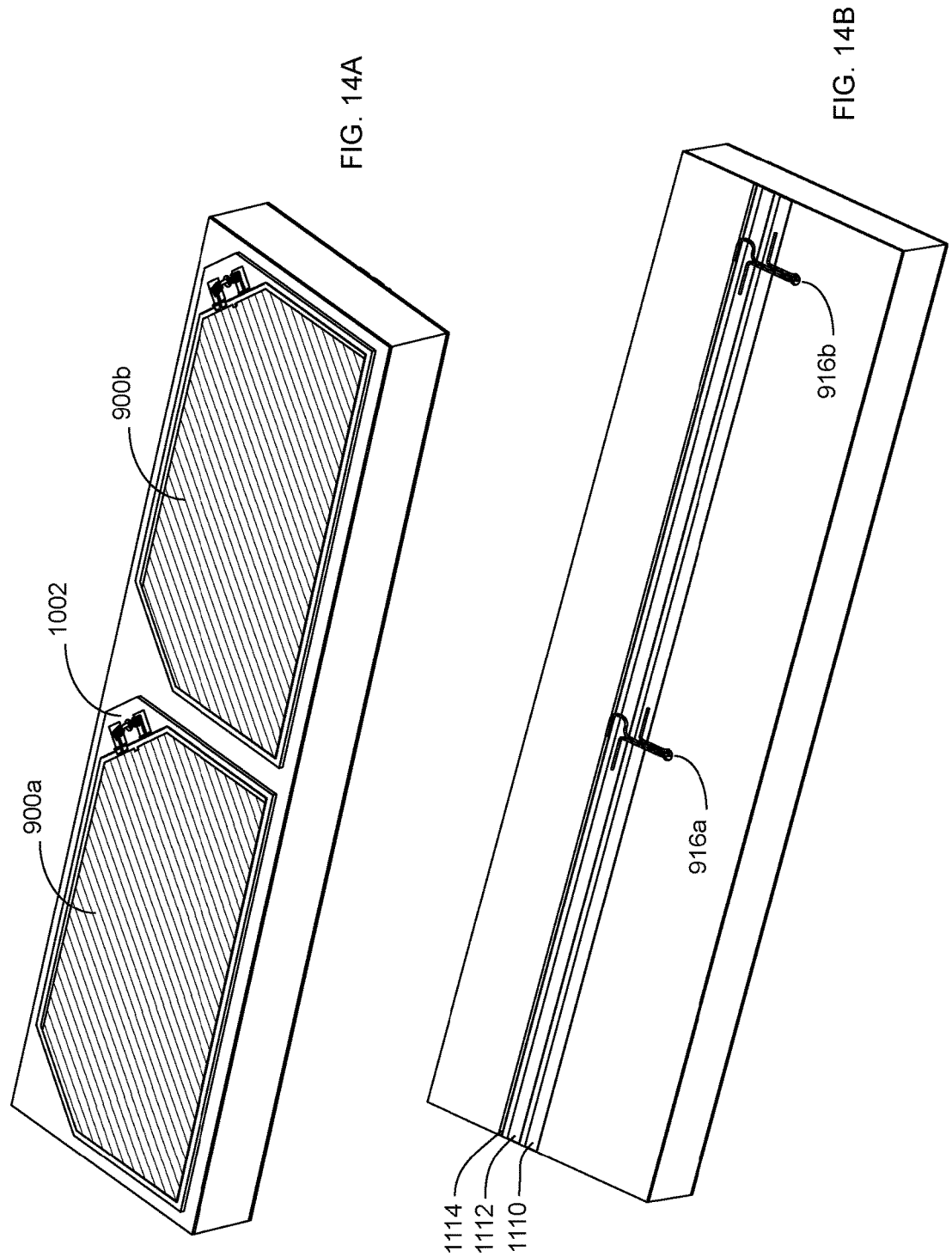

POWER SUPPLY MODULE FOR SPACECRAFT

CROSS-REFERENCE TO RELATED APPLICATIONS

This application is the National Stage of International Application No. PCT/CA2016/050441, filed Apr. 15, 2016, and entitled "POWER SUPPLY MODULE FOR SPACECRAFT."

FIELD OF THE DISCLOSURE

The present disclosure relates generally to circuits or apparatus for power converters, and more particularly to photovoltaic based power supply modules for power subsystems such as those on spacecraft.

BACKGROUND

A photovoltaic cell, commonly termed a solar cell is an example energy harvesting transducer by which energy is captured from the environment and stored or used to feed other circuits, usually termed a load. Kinetic, thermal, solar, biochemical and electromagnetic energy can be transformed into electricity using appropriate harvesting transducers. A GaAs photovoltaic cell can produce a small amount of power (typically in a range from 0 watt (W)) to 1 W at low-voltage (typically in a range from 0 volts (V) to 2.4V direct current (DC)).

Spacecraft solar power subsystems use solar cells to convert solar energy in order to charge onboard batteries and to power onboard loads. In typical spacecraft power subsystems, a number of solar cells are mounted onto a carrier to form a solar panel. A number of cells on a panel are connected in series to provide a desired output voltage with a number of strings connected in parallel to increase the power from a panel. If there is shadowing on portions of the series string, or if there is a failure of one or more solar cells within the string, then that string cannot contribute power and the peak power available from the panel will be reduced. The reduction of panel peak power in this instance would be due to the output of the shadowed string until all other strings fall to the potential of the shadowed string. Also, if multiple solar panels are placed in different orientations on the spacecraft to accommodate various orientations relative to the sun, these panels cannot be continuous strings of solar cells. In other words, if multiple solar panels are mounted on different faces of a spacecraft, a string cannot start on one face and then finish on another face. Shadowing of the portion of the string which is mounted on the non-illuminated face would reduce output from the entire string. Furthermore, cells are usually arranged in a rectangular configuration of blocks interconnected with wire harnesses. These constraints limit the optimal placement of solar cells and reduce the number of cells which can be placed on irregular geometries.

In order to drive an appropriate spacecraft load circuit from the solar panel, a power converter may be implemented at the output of the solar panel to provide requisite power to the load and to charge the spacecraft batteries. For example, in spacecraft applications, a spacecraft power bus is nominally 28V DC but in practice provides a variable impedance load and is permitted to vary from 22V to 34V DC.

Harsh operating environments, such as, spacecraft environments, military environments, extreme weather environments and inaccessible environments, place constraints on power converter circuit design. For example, the energy harvesting transducers provide low output voltage and low output power. Typical power converters contribute their own losses in terms of power conversion and thus require many transducers to be connected in series in order to provide a reasonable output voltage and power. For a solar power system used in a spacecraft environment, the photovoltaic cells experience extremes of thermal swings, ranging from −150° C. to +120° C. within minutes, and high levels of radiation present in space. Power converters are usually placed inside the spacecraft structure remote from the solar cell array, so that the effect of temperature variation and radiation is much smaller. However, this contributes further to inefficiency due to voltage drops in the wiring harness between the solar cell array and its power converter. Furthermore, in these environments, reliability is important and component failure rate must be minimal.

SUMMARY

In accordance with an embodiment of the present disclosure there is provided a power supply module comprising: an energy harvester transducer; an output terminal adapted to provide, from the transducer, converted power having a direct current (DC) output voltage to a variable impedance load, the variable impedance load receiving a load voltage based on the output voltage; a power converter receiving an input power having an input voltage from the transducer and providing a converted power at a boosted voltage relative to the input voltage to the output terminal, the boosted voltage being the output voltage at the output terminal; and a switching circuit driving the power converter to cause the transducer to operate at a maximum power point of the transducer.

In accordance with a further embodiment of the present disclosure there is provided a power supply module for connection to an unregulated spacecraft electrical power bus, the power supply module comprising a solar cell; a power converter attached to the solar cell the power converter providing converted power from the solar cell to an output terminal having a DC output voltage determined by a voltage of the unregulated spacecraft electrical power bus.

In a further aspect there is provided at most a single set of electrical leads composed of no more than a pair of output power leads, and control leads, the output power leads for connecting the output to the unregulated spacecraft electrical power bus.

In accordance with a still further embodiment of the present disclosure there is provided a DC power system for a spacecraft, comprising an unregulated spacecraft power bus; and a plurality of power supply modules connected to the spacecraft bus each power supply module comprising: a solar cell; output terminals; and a power converter attached to the solar cell, the power converter providing converted power from the solar cell to the output terminal having a DC output voltage determined by a voltage of the unregulated spacecraft electrical power bus.

In a further aspect the single solar cell comprises a plurality of solar cells connected in series and/or in parallel.

BRIEF DESCRIPTION OF THE DRAWINGS

The present disclosure will be better understood having regard to the drawings in which:

FIGS. 14A and 14B show respective top and bottom perspective views of multiple power supply modules integrated into a spacecraft panel according to an embodiment of the present matter.

DETAILED DESCRIPTION

Various features, components and methods according to the present disclosure are now described. In the following description references made to the figures, with like numbers represent the same or similar elements.

An embodiment of the present disclosure relates to systems and methods to convert electrical power from an electrical energy transducer, such as a solar cell, to a variable voltage load. In one aspect of the present disclosure there is described a modular solar powered electronic power supply package for providing run-time flexibility and scalability in a DC power system. In another aspect the DC power system is a distributed power system using many of the individual solar powered electronic power supply modules interconnected together in place of a few larger panels of solar cells connected to a central power supply.

According to the one aspect of the present disclosure, the electronic power supply module is powered by a single solar cell to generate an output voltage to the variable voltage load.

In an embodiment of the present disclosure the power supply module comprises a peak power tracker and a battery overvoltage regulator, powered from the single solar cell. In an aspect of an embodiment of the present disclosure, the power supply module is an autonomous unit providing peak power tracking for its individual solar cell as well as providing battery overvoltage regulation for a power subsystem battery. In one configuration multiple redundant power supply modules may be connected to the power subsystem wherein an individual power supply module failure will not compromise the power subsystem. The power supply module of the present disclosure does not rely on a fixed voltage reference to set its output voltage, but instead outputs a load variable DC voltage while operating the solar cell at its maximum power point.

In general, the electronic power supply module according to embodiments of the present disclosure may be used in challenging environments in which special attention is paid to factors such as component selection, circuit topology, physical arrangement and reliability. For example, competing factors in the design of the electronic power supply module according to embodiments of the present disclosure are to achieve one or more aspects of being (i) physically small; (ii) of low mass; (iii) of high power conversion efficiency; (iv) capable of a wide operating temperature range; (v) radiation hardened; (vi) adapted for use with an integrated peak power tracker; (vii) adapted for use with an integrated battery overvoltage regulator; and (viii) low cost.

Figure 1:
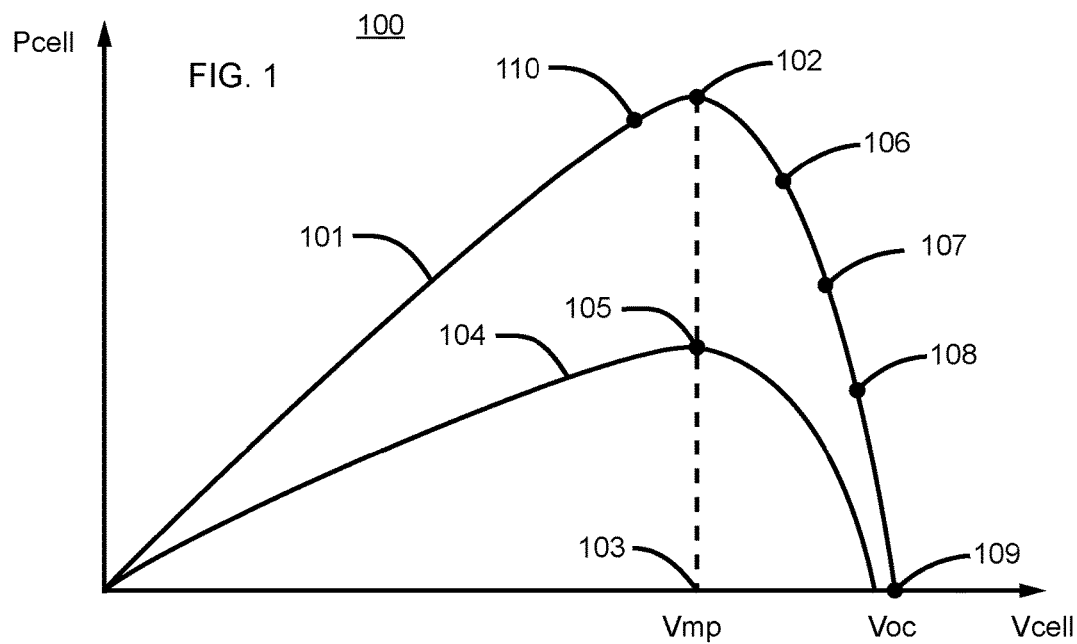
FIG. 1 shows a plot of electrical characteristics of a solar cell at different irradiance levels.

Referring to FIG. 1, there is shown a graph 100 of a cell power versus voltage at different irradiation levels of a typical solar cell (not shown) plotted on an X-Y axis graph. Plot lines 101 and 104 show voltage ($V_{cell}$) on the X-axis versus power ($P_{cell}$) on the Y-axis at respective different irradiation levels for a given temperature. As may be seen there exists a solar cell voltage ($V_{mp}$—Voltage Maximum Power) 103 at which the power from the solar cell is maximized 102. There are two solar cell voltages at which the power is zero. One voltage is 0V and the other is when the solar cell is open circuited $V_{oc}$ 109.

When the solar illumination to the cell is reduced, at a given temperature, the power curve shifts down from curve 101 to curve 104. The change in solar cell characteristics with illumination is directly related to the solar cell's series resistance. With decreasing illumination, the open circuit voltage will decrease slightly but the Vmp point will be essentially unaffected under moderate to high intensity illumination. The result is that the maximum power points on each curve stay at the same Vmp voltage 103 but at reduced power 105. Over time, the solar cell will be exposed to radiation which will reduce the voltage and current at which maximum solar cell power is obtained.

Figure 2:
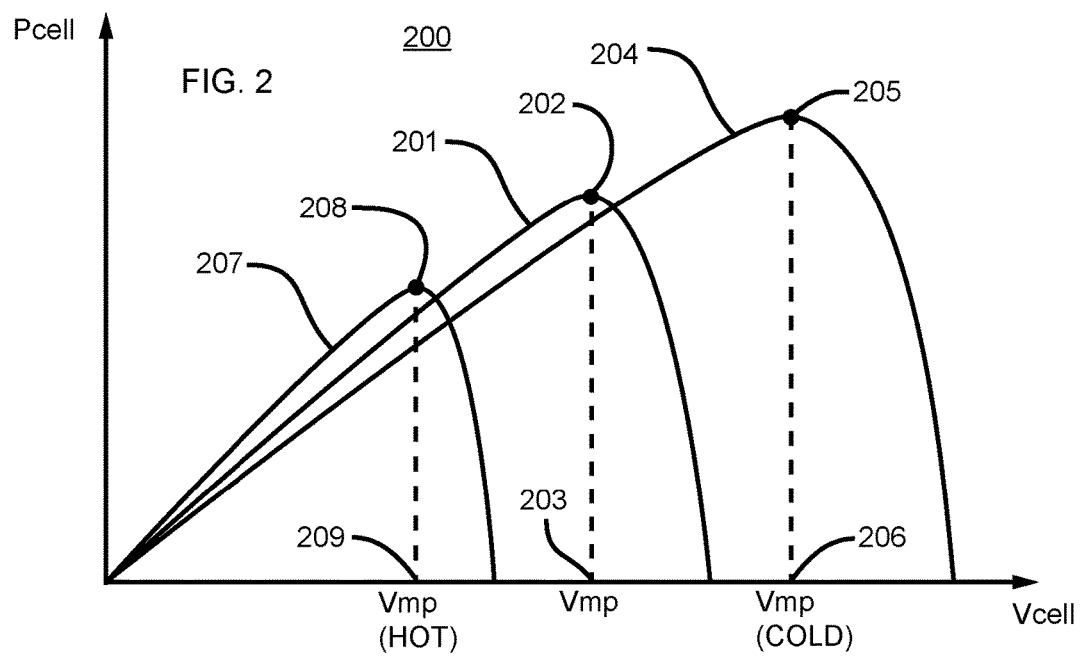
FIG. 2 shows a plot of electrical characteristics of the solar cell at different temperatures.

Referring to FIG. 2, there is shown a graph 200 of power output and voltage for the solar cell (not shown) at different temperatures for a given illumination. Plot lines 204, 201 and 207 show voltage ($V_{cell}$) on the X-axis versus power ($P_{cell}$) on the Y-axis at respective different relative ambient temperatures ranging from cold to hot with their corresponding maximum power points indicated respectively as 205, 202 and 208. As the ambient temperature decreases more power is available from the solar cell and the power output curve shifts upwards. For example, as seen from the graph, at colder temperatures the maximum power point 205 has a corresponding higher voltage of $V_{mp}$ (COLD) 206 compared to $V_{mp}$ (Hot) 209.

Conversely, as the temperature increases, the power available from the cell decreases 207. Both the maximum power point 208 and voltage 209 decrease from the lower ambient temperature power point 202 and voltage 203.

As may be seen from the solar cell power curve, the solar cell should be maintained at the peak power point so that maximum power can be extracted from the solar cell. A power conversion technique which maintains the solar cell at the peak power point may be referred to as a peak power tracking (PPT) system. A common method of finding the peak power point is known as a perturb and observe (P&O) algorithm. In this algorithm, a load presented to a solar array is increased or decreased slightly and the effect of this load change is recorded. An algorithm is used to increase or decrease the operational electrical load presented to the solar array in order to maintain the array at its peak power point. A PPT controller continuously searches for the peak power point and makes appropriate corrections. This method is employed with a centralised controller coupled to an array of series-connected cells. As a result, a failure in a single cell may cause a drop in output from the array. A failure in a controller may cause failure of the entire system. This method is also susceptible to reduced output due to shadowing of portions of the array.

Another technique called a direct energy transfer system (DET) connects solar arrays directly to a load bus (such as a spacecraft bus). DET systems can be series or shunt regulated. In a shunt regulated DET system, regulation relies on a shunt regulator to regulate the load bus voltage. In aerospace applications, the shunt DET system is primarily used on smaller spacecraft and rovers, when the total solar array power is small. The DET system may also use series regulation where solar array string switches permit a variable number of strings to be connected to the spacecraft thereby providing bus regulation. In both DET systems, the direct connection of the solar array allows for an efficient transfer of energy from the solar array to the spacecraft loads. Where excess power is available from the solar array, the shunt regulator converts the excess energy into heat, which is usually wasted energy. A separate battery charge regulator may be connected to the spacecraft battery which is connected to the spacecraft bus through a blocking diode. In order to reduce the dissipation in the shunt regulator, some shunt DET systems have optional switches which can disconnect strings of solar cells from the power subsystem. In this way, the power available from the solar array is reduced, thereby reducing the dissipation in the shunt regulator and permitting the system to be used at higher power levels.

The limitations of the DET system are similar to the PPT system when used on an array, in that the solar cells within strings must be matched. In order to extract the maximum power from the DET and PPT system, the solar cells within each string must be matched and each string of solar cells must also be matched to each other. The process of matching solar cells is expensive since good cells which do not match the characteristics of the array must be rejected. The problem of solar cell shadowing has a larger effect on DET systems since the number of cells is much less than high powered PPT systems.

This shadowing affects the amount of energy which can be extracted from the shadowed string and also reduces the overall efficiency of the DET power subsystem. Another limitation in applications such as rovers is that strings of cells are usually placed in rectangular blocks and interconnected with wire harnesses. For small spacecraft and rovers, this constraint limits the optimal placement of solar cells and reduces the number of cells which can be placed on irregular geometries.

Figure 3:
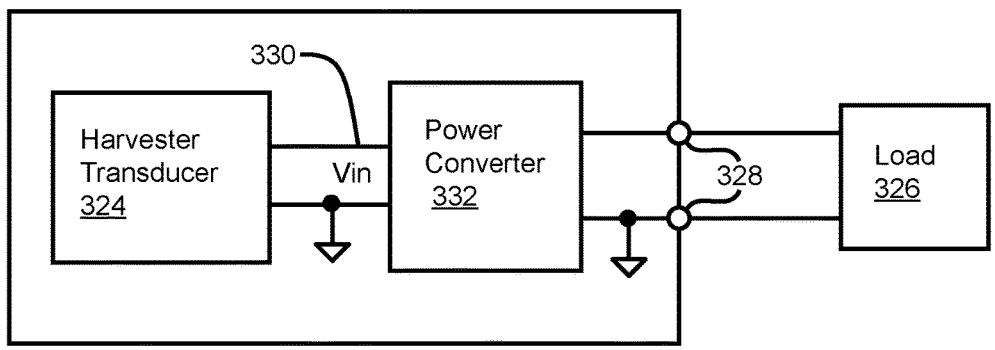
FIG. 3 shows a block diagram of an electronic power supply module according to an embodiment of the present disclosure.

Referring to FIG. 3, there is shown a block diagram of a power supply module 300 according to a general embodiment of the present disclosure. The power supply module 300, comprises an energy harvester transducer 324, an output terminal 328 adapted to provide from the transducer 324, converted power, having a direct current (DC) output voltage to a load 326 of variable impedance where the variable impedance load 326 receives a load voltage based on the voltage at output terminals 328, a power converter 332 receiving an input power having an input voltage 330 from the transducer 324 and providing a converted power at a boosted voltage relative to the input voltage to the output terminal 328, the boosted voltage being the output voltage at the output terminals 328. The power converter 332 includes a peak power tracking circuit to continuously extract power from the transducer 324 at its maximum power point and is a current source to the connected load 326. The power converter 332 of the present disclosure thus avoids problems associated with driving the output 328 to a fixed reference voltage or problems associated with implementing a regulated output voltage 328. The power supply module provides a self-contained package of one or more harvesting transducers that provides a defined power output at a set of output terminals which can be simply connected to a power bus. For example, the package may have a plug output which plugs into corresponding sockets in a power bus. Examples of connecting the package to a power bus are described later in the description.

Figure 4:
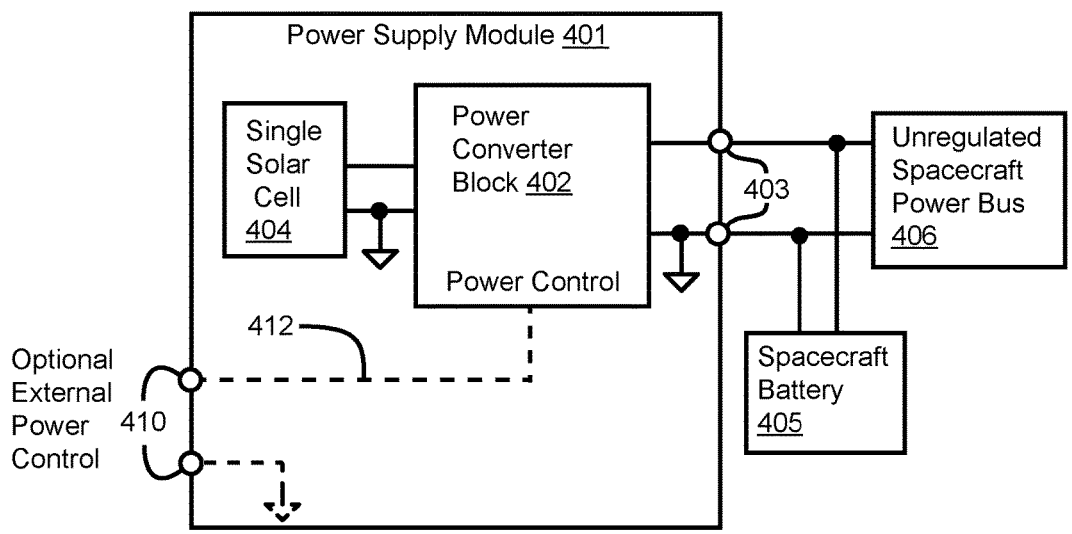
FIG. 4 shows a block diagram of a spacecraft power subsystem using the electronic power supply module according to an embodiment of the present matter.

Referring to FIG. 4 there is shown a block diagram of a spacecraft power system 400 according to an embodiment of the present disclosure. The spacecraft power system 400 includes the power supply module 300 termed herein a power supply module 401 having a single solar cell 404, a power converter block 402 to provide converted power from the single solar cell 404 at the output terminal 403. The converted power having a DC output voltage to a spacecraft electrical power bus 406. A spacecraft electric battery 405 may also be connected to the output terminal 403 of the power supply module 401 and to the spacecraft power bus 406, which typically is unregulated. The unregulated power bus 406 and/or the spacecraft battery 405 provide a load of varying impedance over time to the power supply module 401.

The output 403 of the power supply module 401 is a current source to the load. Generally, the load voltage is that of the spacecraft battery voltage, which may vary over time. If the output terminal of the power supply module 401 is an open circuit, then the voltage at the output would theoretically increase to infinity causing damage to the power supply module. In one embodiment a control signal line may be implemented within the power supply module to limit the power supply module at a pre-set output voltage so as, for example not to overcharge a spacecraft battery.

In another embodiment a reduction of battery charge current at colder temperatures than normal operating temperatures may be implemented in order to prevent damage to the spacecraft battery. Recall from FIG. 2 that the maximum power point of the solar cell increases with decreasing temperature. If for example the battery has a much lower power capacity than the power supply module, the power supply module may include external power control line input 410 for receiving a power control signal 412 to control the power output of the power supply module. In general, for spacecraft with very large solar power supply module arrays the battery charging current may be regulated through the external power control line input 410.

The power supply module 401 operates in a manner that is different to the PPT and DET systems described earlier. Energy from the single solar cell may be converted to drive a voltage onto the power bus for a particular application. For example, in a spacecraft, the bus voltage is nominally 28V. The energy from a 2.4V solar cell, for example, would be converted to a 28V bus voltage. The terms bus voltage and battery voltage are used interchangeably here as the spacecraft power supply bus is primarily driven by a spacecraft battery thus in effect the power supply module is used to charge the battery (load). Of course there could be occasions when the power supply bus may be driven directly from the power supply module. Since each power supply module contains a solar cell, the outputs of all power supply modules can be combined to form the spacecraft power bus. In which case, the output of the parallel combination of power supply modules may be fed directly to the spacecraft battery. In addition to generating the spacecraft bus voltage, the power supply module 401 may charge the battery.

The power supply module 401 according to the present disclosure includes features which are further described herein:

Implementation and scalability—Spacecraft power subsystems have a minimum power threshold in order for mission requirements to be met. In order to reduce mass, it is common for the spacecraft power subsystem to be customized for each mission. In the case of the prior PPT system described earlier, a custom peak power tracker and battery charge regulator would be designed for each spacecraft. For the prior DET system, the shunt and battery charge regulator would also be custom designs. In the case of the power supply module 401 of the present disclosure, the design of each module does not change. Each power supply module 401 may for example provide about 1 W of electrical power. The design of a 100 W spacecraft power subsystem, using power supply modules 401 of the present disclosure, would comprise 100 power supply modules 401 connected in parallel. Additional modules may be added for redundancy purposes. This additive aspect provides flexibility in the design of the power subsystem enabling it to be scaled for each mission with minimal non-recurring engineering effort. The parallel configuration of modules provides a great deal of redundancy into the system since the failure of a single module would only reduce the overall system power by 1 W. While a single solar cell provides the most compact and flexible physical arrangement, multiple solar cells could also be used in the same modular package. Thus individual modules could provide a higher output power. Further multiple cells in the same module may be connected to provide redundancy within the same module. The multiple cells within a module may be connected in series or parallel or even a combination of both types of connections.

Solar Cell Matching—The implementation of prior PPT and DET techniques in power subsystems requires that each solar cell in a string have similar electrical characteristics and have the same orientation to the sun. This is required because the peak power point of each solar cell must closely match the peak power point of the string of cells. The matching of solar cells is costly since good cells must be rejected if they do not match the peak power point of a string. In the case of the power supply module of the present disclosure, the peak power tracking function takes place within the power supply module thereby automatically regulating the peak power point at the individual solar cell level. This avoids solar cell matching.

Power Controller Loss—The prior PPT system requires a digital or analog computer to run the "perturb and observe" algorithm. This overhead in the peak power tracker, as well as the efficiency of the battery charge regulator, contributes to a processing loss. The percentage of loss will vary with the size and power of the spacecraft. The prior DET system has minimal power controller losses since the solar array energy is transferred directly to the spacecraft bus, however these techniques still suffer from the disadvantages mentioned earlier. The power supply module 401 of the subject disclosure also has minimal losses due to the efficiency of the integrated module and its ability to directly connect to the spacecraft power subsystem bus.

Power Subsystem Redundancy—For the prior PPT and DET power subsystems, redundancy is achieved by duplicating the electronic assemblies. This can be done by duplicating the printed circuit boards within a common chassis, duplicating the circuitry on the same printed circuit board or through the construction of two independent electronic chassis. Most spacecraft with critical operational missions have redundant power subsystems. The power supply module of the present disclosure has inherent multiple redundancy by design since each module is an independent power source. For example, a 100 W power subsystem would consist of 100 independent power supply modules tied together to deliver their power to the spacecraft bus and battery. The loss of one power supply module would reduce the spacecraft power by only 1 W.

Sustained Arc Discharge—The increasing power level demanded by new generations of spacecraft (geostationary satellites in particular, as well as structures such as the International Space Station) requires that the solar arrays generate electric power at 100V and higher. Such high voltage levels have been recognized to produce arcing between solar cells during sub-storms, threatening the stable supply of solar array power and, in some cases, leading to catastrophic solar array failure. As the voltage of the solar arrays increases, the risk of one trigger arc growing into a catastrophic arc increases. A threshold for the occurrence of sustained arcing is typically 40V between cells. The power supply module 401 of the present disclosure may be configured to have a voltage between cells of less than 2.5V, to enable high-power solar arrays to be constructed without the risks associated with sustained arc.

Figure 5:
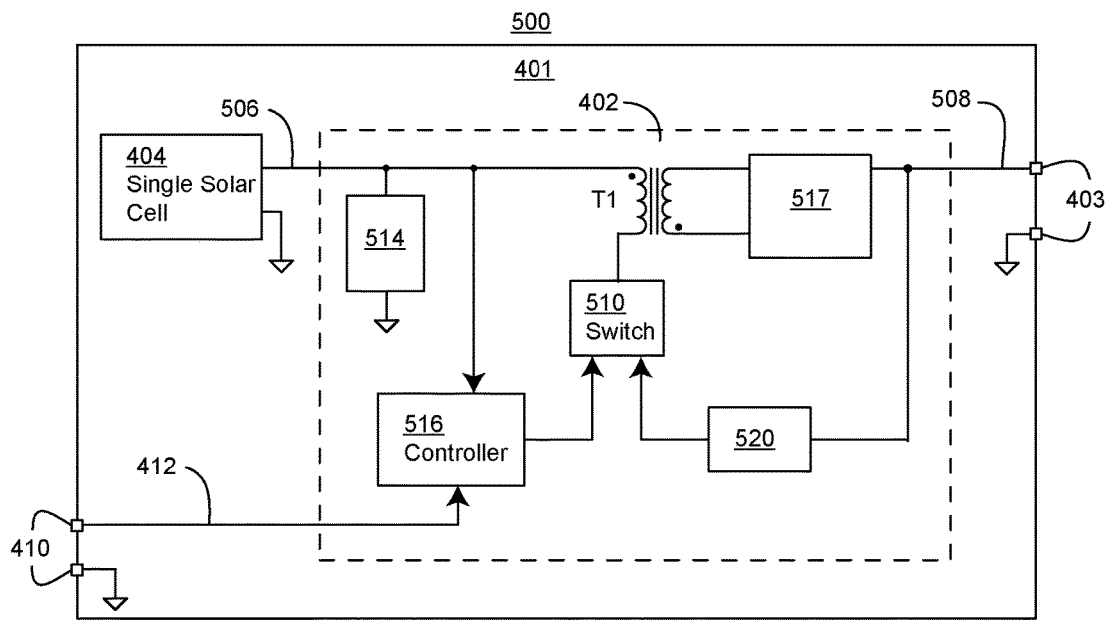
FIG. 5 shows a block diagram of the electronic power supply module according to an embodiment of the present matter.

Referring to FIG. 5, there is shown a block diagram 500 of an example implementation of the power converter block 402 of the power supply module 401 described with reference to the embodiment of FIG. 4. The power converter block 402 is comprised of an input 506, connected to receive the output of the single solar cell 404, an output 508 connectable to the output terminals 403, a transformer T1, a charge storage element 514 connected to the input 506 and the primary winding of the transformer T1 for transferring charge from the charge storage element 514 to the transformer T1, a main switching element 510 connected to the primary of the transformer T1, a switch control circuit 516 coupled to monitor a voltage level of the charge storage element 514 to control a switching frequency of the transformer T1 via the main switching element 510, based on the monitored voltage level of the charge storage element 514, and a rectifier with output filter 517 to filter the output from the secondary of the transformer T1 so that the output 508 receives a DC voltage.

In a further embodiment of the circuit topology 500 the output 508 is monitored by an output limiting circuit 520 to limit the peak voltage output at 508 by generating a feedback control signal which is applied to main switching element 510 if the output voltage exceeds the maximum battery charge voltage or maximum bus voltage.

In a still further embodiment of the circuit topology 500 the external power control input terminal 410 may allow an external power control signal 412 to be applied to the switching circuit 516 to change the switching frequency of the transformer T1 to limit or turn off the power supply module.

In a further embodiment the switching frequency of the transformer is determined by the known peak power voltage of the single solar cell 404 and a value of the charge storage element 514. In an embodiment a ripple voltage level on the storage element 514 determines the switching frequency of the transformer T1 where the ripple voltage is generated by limiting the charging and discharging of the charge storage element between an upper and lower voltage range about a median voltage determined by a predetermined peak power point voltage of the solar cell. In a further embodiment the ripple voltage is generated by the controller 516.

Figure 6A:
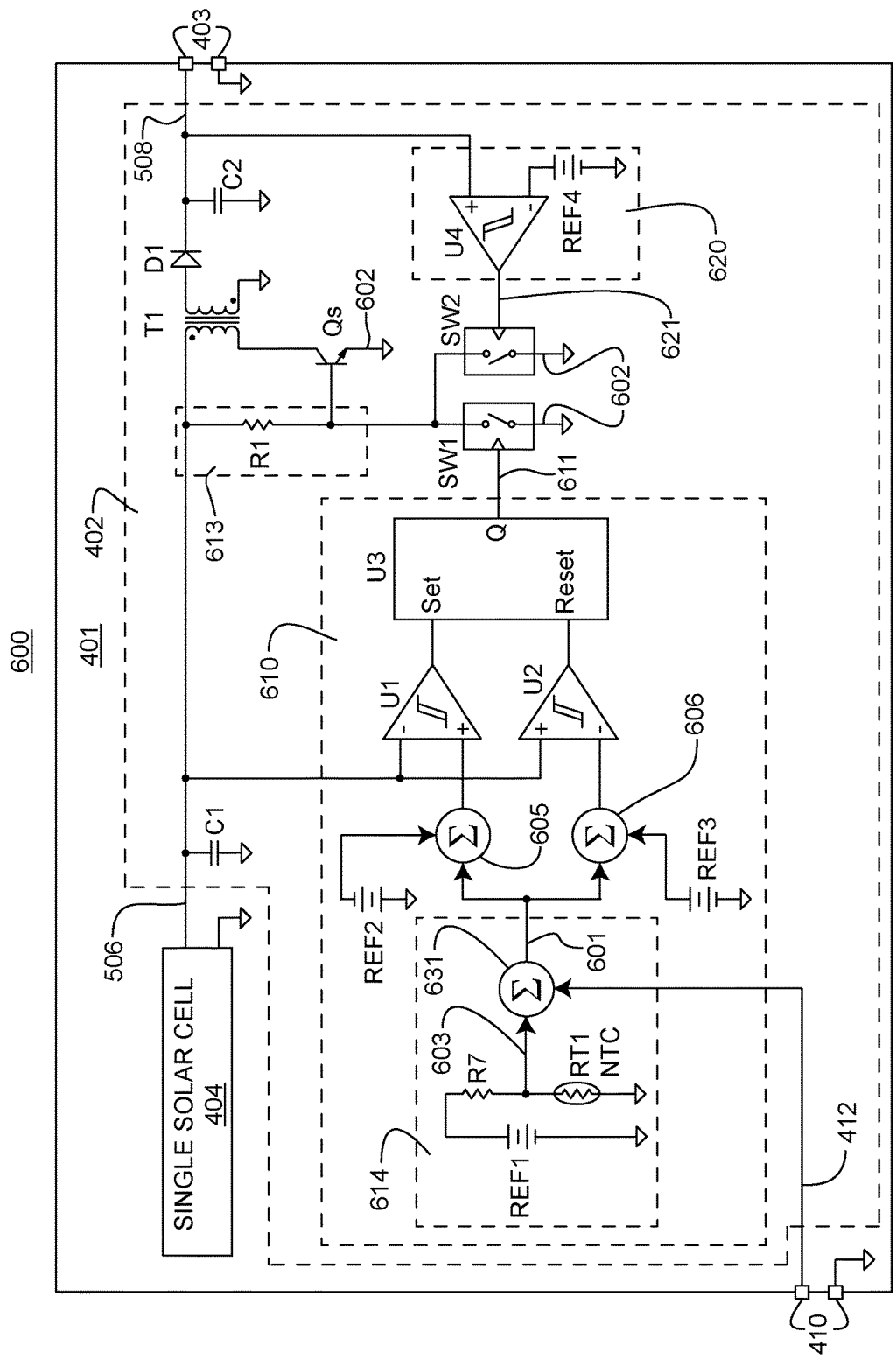
FIG. 6A shows a first circuit topology of a power converter of the electronic power supply module according to an embodiment of the present matter.

Referring to FIG. 6A there is shown a circuit topology 600 of an example implementation of the power converter block 402 of the power supply module 401 according to another embodiment of the present disclosure. The power converter block 402 comprises, a capacitor C1 charge storage element connected to the base terminal of switching element transistor Qs through a bias resistor R1 and further connected to a terminal of the primary of transformer T1, the other terminal of the primary being connected through the collector-emitter terminals of the transistor Qs to ground reference voltage 602. The power converter block 402 further includes a switch control circuit 610 connected to make use of a ripple voltage on the capacitor C1 and to generate a control signal 611 to control a first switch SW1 in response to the measured ripple voltage on C1 and thereby a switching frequency of the power converter. The first switch SW1 is connected to the base bias circuit of Qs to selectively open-circuit or short-circuit the base bias 613 of Qs based on the control signal from the switch control circuit. When first switch SW1 is closed the base bias circuit 613 may be connected to ground 602. The secondary of the transformer T1 is connected to a rectifier diode D1 and output filtering capacitor C2 which is in turn connected to output 508 to generate the output voltage of the power converter.

The switch control circuit 610 generates a ripple voltage on the capacitor C1 by allowing the capacitor C1 to charge from the single solar cell 404 to a pre-set upper voltage reference level and to discharge to a pre-set lower voltage reference level. This is achieved by using a pair of ripple voltage references REF2 and REF3, set to the upper and lower voltages corresponding to respective upper and lower limits of the desired ripple voltage on capacitor C1. In an embodiment a pair of comparator functions are implemented to determine when the charge voltage on the capacitor C1 is above or below the ripple voltage limits. In this embodiment, each of the pair of ripple voltage references REF2 and REF3 is connected to respective one of the pair of input terminals of comparators U1 and U2. The voltage across the capacitor C1 is applied to the other of the input terminals of the comparators U1 and U2. The outputs of the comparators may be connected to respective set and reset inputs of a latch U3 the output of which is connected to drive the first switch SW1.

In order to maintain the solar cell operating at its maximum power point, the switch control circuit 610 includes in a further embodiment a maximum power point circuit 614 for maintaining the single solar cell 404 at its maximum operating power point. In the illustrated topology, the maximum power point circuit 614 is comprised of a maximum power point voltage reference REF1 set to the maximum power point voltage of the single solar cell 404 which was for example illustrated previously in FIG. 1. The maximum power point voltage reference REF1 outputs a voltage which the solar cell and capacitor C1 must be maintained at in order to extract the maximum power from the solar cell. The voltage reference REF1 may include an optional temperature compensation element to compensate for changes in the maximum power point due to temperature effects on the single solar cell 404 which was for example illustrated previously in FIG. 2. In the illustrated embodiment the temperature compensation element is formed by a resistive divider comprised of a resistor R7 and thermistor RT1 connected at the output of the voltage reference REF1 to modify the reference voltage REF1. In either case the voltage reference REF1 is added to the pair of ripple voltage references REF2 and REF3 by respective adders 605, 606. Adders are well known in the art and may be implemented using for example any one or more of op-amps or discrete components. Further the voltage references may be implemented for example with diodes. The negative temperature co-efficient thermistor may be linearized with series and parallel resistors in order to reproduce the degree of temperature compensation for the solar cell.

In the implementation 600 shown in FIG. 6A, the external power control input 410 is implemented as an external control voltage signal 412 which is added to the modified temperature compensated reference voltage 603 through adder 631 as described earlier. Alternatively, the external control signal may also be added directly to the maximum power point voltage reference REF1 to be applied to the switching circuit 610. This external control signal reduces the output power of the power converter as the DC signal is increased. The reduction in power is accomplished by modifying the operating point of the solar cell as described in FIG. 1 as for example indicated by any one or more of labels 106, 107, 108, 109. At an upper limit of the external power control DC input range, the output power goes to zero and the power converter is therefore in the OFF state 109.

In a further embodiment, a second switch SW2 is connected in parallel with the first switch SW1. The second switch SW2 is connected to be driven by the feedback control signal output from the limiting circuit 620. The output limiting circuit 620 includes an output voltage reference limit REF4 and a comparator U4 having one of its inputs connected to the reference REF4 and the other of the inputs connected to monitor the output 508 of the power converter, the output 621 of the comparator U4 is connected to drive the second switch SW2. When the output voltage of the power converter exceeds the reference voltage REF4 the switch SW2 is closed short-circuiting the bias circuit of Qs to ground turning Qs OFF.

Figure 7:
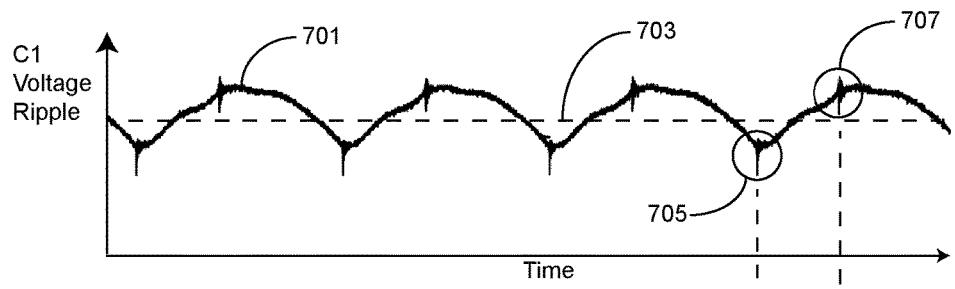
FIG. 7 shows a plot of ripple voltage across a charge storage element according to an embodiment of the present matter.

Referring to FIG. 7 there is shown the voltage ripple across charge storage element capacitor C1 over time 701. In the implementation 600 described above, the reference REF2 is a negative reference and is added to the output of 601 of maximum power point circuit 614 using adder 605. The output of 605 corresponds to the lower reference level shown as 705 in FIG. 7. In a similar manner reference REF3 is a positive voltage and is added to the output 601 of maximum power point circuit 614 to produce the upper reference level 707 in FIG. 7. Comparator U1 detects the condition when the voltage on C1 is less than the output of adder 605. In this case the output of U1 sets latch U3 causing switch SW1 to close turning Qs OFF. In a similar manner, comparator U2 detects the condition when the voltage across C1 is greater than the output of adder 606. In this case the output of U2 resets the output of latch U3, opening switch SW1 which turns Qs back ON.

Operation of the power converter may be better understood by referring to its three distinct phases of operation: start up, PPT ON Cycle and PPT OFF Cycle. Each of these phases will now be described.

At start-up when there is no sunlight on the single solar cell 404, the power supply module is OFF. When the solar cell is illuminated, the capacitor C1 starts to charge providing energy to the control circuits causing the switch SW1 to be in the ON state (closed) and the switch SW2 to be in the OFF state (open). With switch SW1 closed, the voltage on the capacitor C1 continues to rise until its voltage is greater than the limit voltage reference level set at the output of adder 606, at which point U2 generates a signal at the RESET input of U3 which resets U3 to drive its output Q high, forcing SW1 to its OFF (open) state. This permits a current to flow through series resistor R1, and the base-emitter junctions of Qs turning the transistor Qs ON. A current now flows through the primary of current transformer T1 connected to the collector of the switching transistor Qs and storing energy in T1. This current will flow as long as R1 provides a bias current to the base to emitter of Qs.

Figure 8:
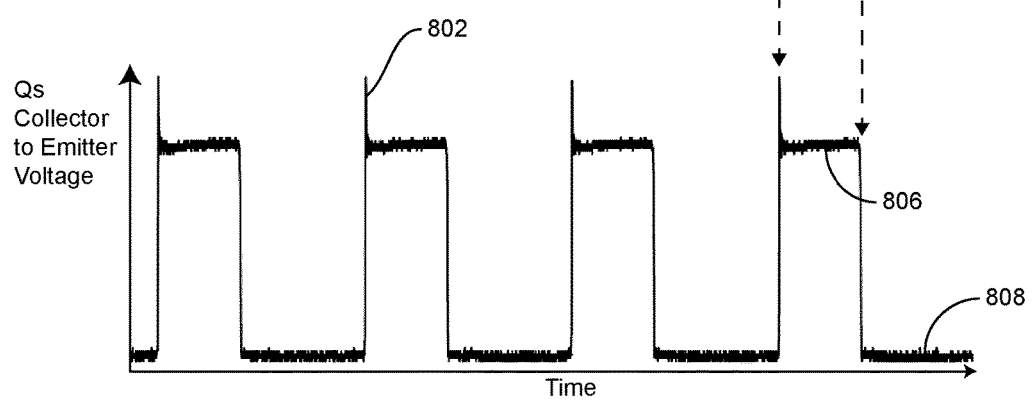
FIG. 8 shows a plot of a collector-emitter voltage of a switching transistor according to an embodiment of the present matter.

During the PPT ON cycle the current will continue to flow through the main switching transistor Qs. When Qs conducts, the voltage on C1 drops, when the voltage on the capacitor C1 drops below a pre-set limit set by the resulting reference voltage set by REF1, REF2 and the optional external control voltage, the comparator U1 is triggered to SET the latch U3. When the capacitor voltage C1 is above this limit, transistor Qs is ON and the switch SW1 is OFF permitting the main switching transistors Qs to be ON. When the capacitor voltage drops below the pre-set limit, U1 will set U3 and switch SW1 will turn ON thereby cutting the drive to the transistor Qs turning it OFF. This is how the power supply module ON time is established. This may be seen from the graph of FIG. 8 which shows the collector-emitter voltage of Qs over time 802 at the switching points of the FIG. 7 ripple voltage across the capacitor C1.

For the PPT OFF cycle, once the switching transistor Qs has been turned OFF, there is energy stored in transformer T1 which must be reset. This reset current will flow through the secondary of T1. When the current through T1 and Qs is stopped, the energy stored in T1 is transferred to the secondary winding of T1 where it is rectified by D1 and filtered by C2. The output 508 is a DC voltage equal to the spacecraft battery voltage with a current proportional to the (Energy Stored in T1)*Frequency/(DC Voltage). The current through Qs can be stopped by shorting the base of Qs to ground through switches SW1 and/or SW2. In other words referring back to FIGS. 7 and 8, when the capacitor voltage decreases to the level at 705, Qs is turned OFF 806. The OFF state of Qs permits the solar cell to re-charge C1 and its voltage rises. When the voltage across C1 reaches 707, Qs is turned ON 808 causing the voltage across C1 to once again drop to 705. This cycle repeats itself resulting in a self-oscillating circuit with a frequency determined by the size of capacitor C1 the value of the bias resistor R1 and the upper 707 and lower 705 voltage limits of C1 which maintains the solar cell voltage at its maximum power point. It may be seen that the power converter of the present disclosure reduces the disadvantage associated with the use of external timing components such as a crystal oscillator or timing integrated circuits. The capacitor C1 thus serves the multiple purposes of being a storage component, input filter and timing component for the power converter.

As mentioned previously, in order to extract the maximum power from the solar cell, the output voltage of the cell and voltage across C1 must be set to a fixed value, compensated for temperature effects on the solar cell. This fixed voltage 603 indicative of the maximum power point voltage of the solar cell is shown in the implementation of FIG. 6A as the output of REF1 divided by the resistive divider R7 and RT1. This reference voltage 603 is shown in FIG. 7 as the dashed line 703.

Further, as mentioned previously in order to modify the power output of the module, the maximum power point voltage 603 may be increased by adding the external analog DC signal 412 to the maximum power point voltage 603 using adder 631.

Further, the output current of the power converter will charge the spacecraft battery and cause its voltage to rise. When the output voltage at 508 exceeds a pre-set internal limit of REF4, the second switch SW2 is closed and Qs is turned off. This action turns the power supply module off as long as the output at 508 exceeds REF4. This turn off action is to protect the spacecraft battery from an overvoltage condition as well as to protect the power supply module from excessive output voltage when it is operating with its output terminals 403 open circuited.

Thus it may be seen that the power supply module of the present disclosure, is capable of modifying the module output power by modifying the solar cell operating voltage away from its maximum power point voltage Vmp. The maximum power is reduced as the DC signal at the module power control terminals is increased. As the power control terminal voltage increases the solar cell power output decreases, and if the voltage is sufficiently high at the power control terminals, the power supply module is turned off 109.

Over time, the solar cell will be exposed to radiation which will reduce the voltage at which maximum solar cell power is obtained. To compensate for this effect, the power supply module input operating voltage may be set lower than Vmp 110, shown in FIG. 1, slightly reducing the module output power. The external power control may then also be used to increase the internal fixed power supply module input voltage to the Vmp setting without having to provide any changes to the internal voltage references in the circuit. As the cell ages due to radiation, the external power control signal is reduced permitting the solar cell to operate at its radiation reduced Vmp. It may be remembered that for GaAs solar cells (typically used in spacecraft) the Vmp parameter is not affected by illumination level.

In one implementation the power supply module for space applications may be implemented using discrete transistors and diodes. The use of discrete transistors and diodes has an advantage for space applications in that these discrete devices are inherently radiation hardened leading to a compact, low cost implementation for space applications where cost, low component count, efficiency and radiation hardness are important considerations.

Figure 6B:
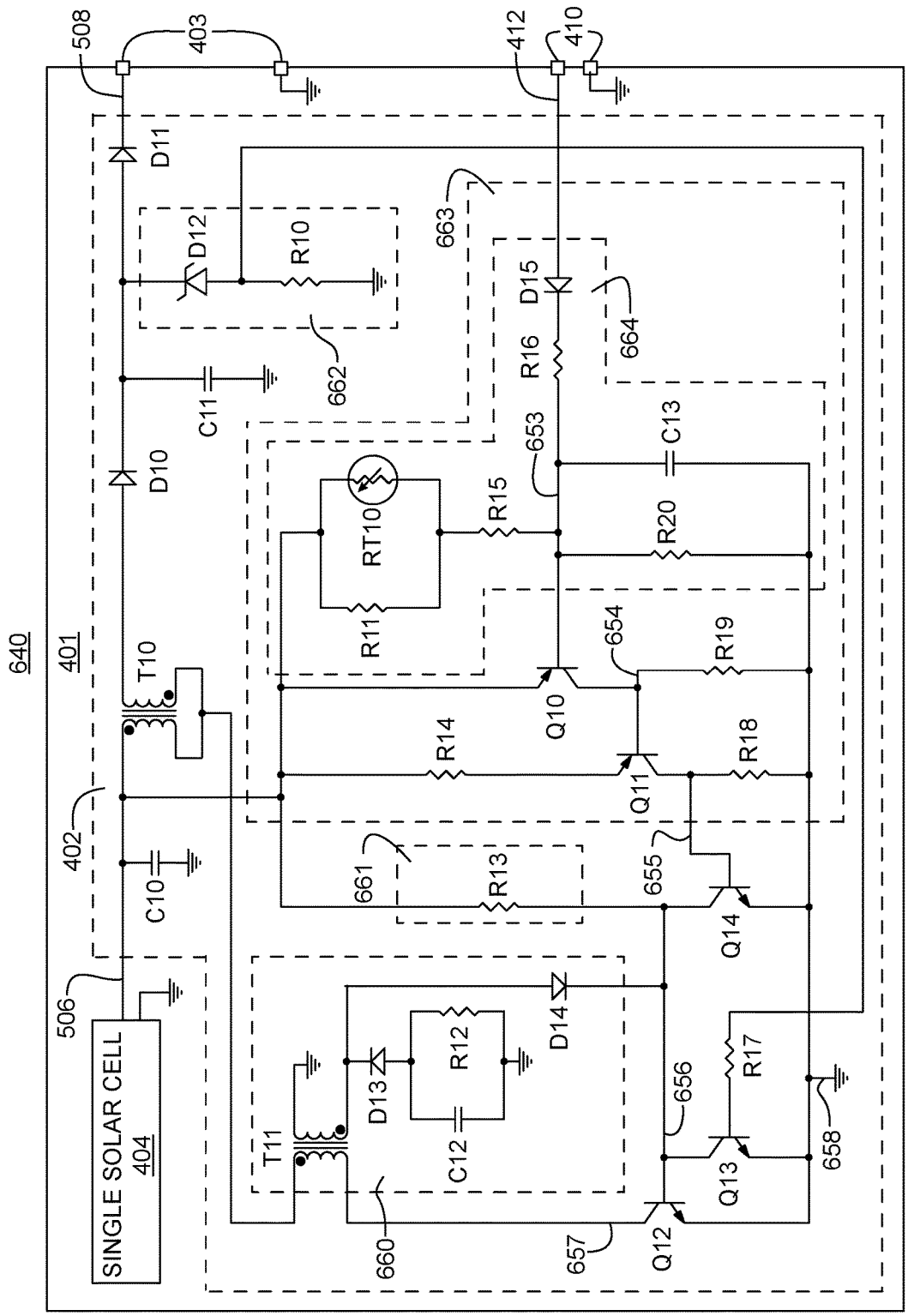
FIG. 6B shows a second circuit topology of the power converter of the electronic power supply module to another embodiment of the present matter.

Referring to FIG. 6B there is shown a circuit topology 640 of an example implementation of the power converter block 402 of the power supply module 401 according to another embodiment of the present disclosure. As previously described, one or more solar cells 404 are connected to input 506. The charge storage element C1 of FIG. 6A is implemented with one or more capacitors C10 in parallel. Transformer T1 of FIG. 6A is implemented with a coupled inductor fly back transformer T10. The secondary winding of T10 is connected to a rectifier and output filter D10 and C11. The capacitor C11 may consist of one or more capacitors in parallel. An optional rectifier diode D11 connected in series with D10 may be used to provide additional fault tolerance at the expense of a slight loss in efficiency. The output of the converter 508 is connected to terminals 403.

The switching transistor Qs in FIG. 6A is implemented by a transistor Q12 shown in FIG. 6B which may consist of one or more transistors in parallel. The base bias circuit 613 of FIG. 6A is shown by block 661 in FIG. 6B. The switches SW1 and SW2 in FIG. 6A are implemented as transistors Q14 and Q13 respectively in FIG. 6B connected to the base terminal of transistor Q12 for selectively commutating R13, the base bias circuit 661 to ground.

The efficiency of the power converter block 402 may be improved by increasing the base current to the main switching transistor Q12 when it is ON by changing the primary to secondary turns ratio of a current transformer T11. This is accomplished by circuit block 660 where the primary winding of the current transformer T11 is connected between the primary of T10 and the collector of Q12. The secondary winding of T11 is connected to the base of Q12 through D14, thereby proportionally adjusting the current to the base of Q12 during the time that Q12 is ON. D13, C12 and R12 are used to reset T11 when Q12 turns OFF.

The output voltage limiting circuit 620 in FIG. 6A is shown in block 662 in FIG. 6B. The zener diode D12 may be implemented with one or more zener diodes in series. When the output voltage of the converter exceeds the zener voltage, a current passes through series connected resistor R10 creating a potential which creates a current through a resistor R17, connected to drive a base of transistor Q13 if the base turn on voltage of Q13 is exceeded. Current then flows into the base of transistor Q13 turning Q13 ON the transistor thereby commutating the base bias of transistor Q12 to ground turning the converter OFF. Transistor Q12 will remain in the OFF state until the output voltage has decreased below the zener diode D12 threshold and current transformer T11 has reset. The switch control circuit 610 in FIG. 6A is implemented by the components shown in block 663 in FIG. 6B and the maximum power point circuit 614 in FIG. 6A is implemented by the components shown in block 664 in FIG. 6B. Referring to FIG. 6B the temperature compensated peak power point reference 653 is implemented by dividing the capacitor C10 voltage using the resistor network comprising of R11, RT10, R15 and R20. Thermistor RT10 is used to provide temperature compensation. Resistors R11 and R15 are used to optimize the circuit response. The reference voltage 653 is equal to the voltage at C10 minus the base to emitter voltage of Q10. The external power control signal 412 is connected to terminals 410 and is summed to the reference voltage 653 through D15 and R16. Capacitor C13 is used to filter the reference 653.

The operation of the switch control circuit 663 may be better understood by referring to the two distinct phases of operation: C10 ripple voltage high and C10 ripple voltage low. Each of these phases will now be described.

Figure 6C:
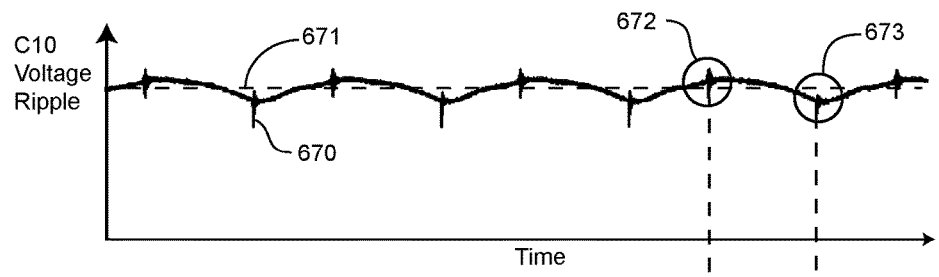
FIG. 6C shows a plot of ripple voltage across a charge storage element in the circuit topology of FIG. 6B.

Referring to FIG. 6C there is shown the voltage ripple 670 across capacitor C10. This ripple voltage magnitude is caused by the switching frequency of the convertor, current taken by the convertor and the value of capacitor C10 shown in FIG. 6B. The reference voltage 653 is shown by the dotted line 671. When the ripple voltage is high, the line 672 is higher than the line 671, a current flows through the emitter to base of Q10 turning the transistor ON. In the ON State the voltage at 654 is equal to the C10 voltage minus the emitter to collector saturation voltage.

Figure 6D:
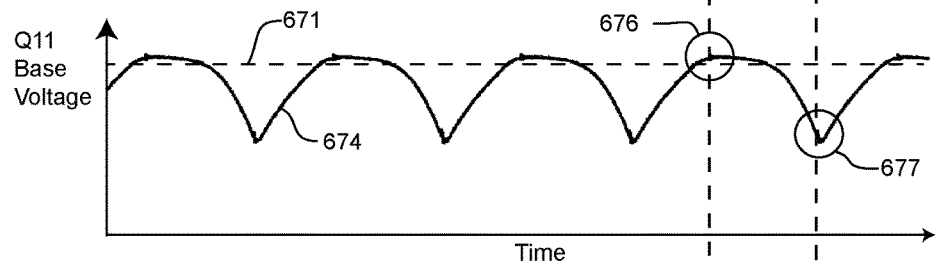
FIGS. 6D to 6F show a plot of voltages at respective base terminals of transistors in the circuit topology of FIG. 6B.

Referring to FIG. 6D there is shown the Q11 base voltage 674 and the reference voltage 653 is shown by the dotted line 671. The high ripple state is shown at 676 where it can be seen that the voltage is similar to the voltage on C10. As the ripple voltage on C10 decreases, transistor Q10 exits its saturated state and leads to a fall in the voltage at 654 shown as 677 in FIG. 6D which is an amplified version of 673 in FIG. 6C.

Figure 6E:
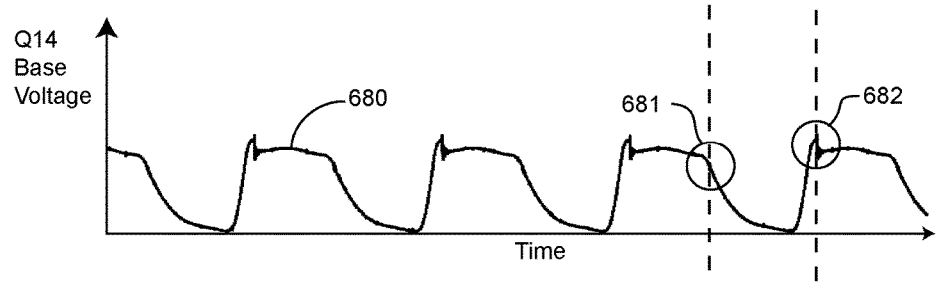

The signal at 654 is further amplified by Q11, R14 and R18 resulting in signal 655. The amplification by Q11 also references the signal to ground potential 658. Referring to FIG. 6E there is shown the Q14 base voltage 680 with corresponding high base voltage ripple 681 and low base voltage 682 ripple points.

Figure 6F:
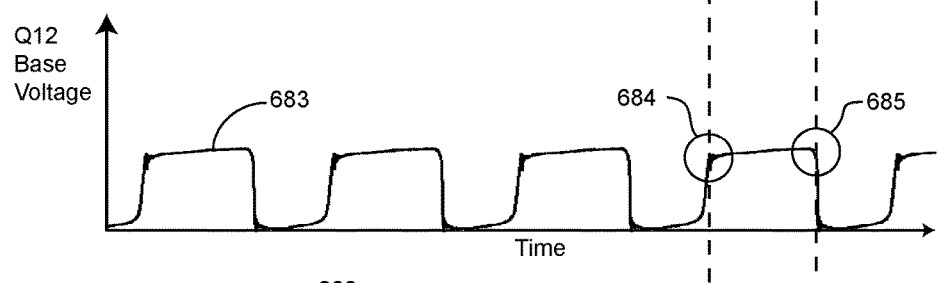

The base signal at 655 is further amplified and squared off by Q14 which is also used to commutate the base bias circuit 661 to ground 658. Referring to FIG. 6F there is shown the amplified Q12 base signal 683 with corresponding high base voltage ripple 684 and low base voltage ripple 685 points.

Figure 6G:
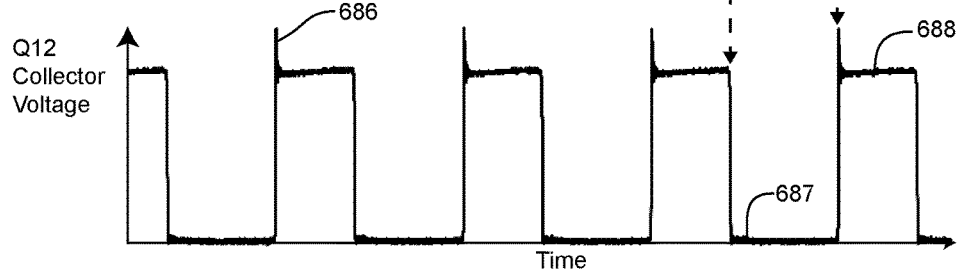
FIG. 6G shows a plot of a voltage at a collector terminal of a switching transistor in the circuit topology of FIG. 6B.

The signal at 656 is used to drive the main switching transistor Q12. Referring to FIG. 6G the collector voltage 657 of Q12 is shown as 686 with the resulting ON state 687 and OFF state 688.

The discrete implementation of the switch control circuit is based on the use of the base to emitter voltage of transistor Q10 as a reference. With this approach no additional references are required and the inherent radiation hardness of the base to emitter voltage creates a stable reference. The temperature effects of the base to emitter voltage are compensated by thermistor RT10.

The present discrete implementation has shown only one of many possible implementations of FIG. 6A using discrete components. Other implementations of the circuit may also be implemented by configuring a custom integrated circuit to perform the functions described herein or implemented using a combination of discrete low power op-amps, latches and comparators.

Other implementations of the circuit may be implemented by configuring a custom integrated circuit to perform the functions described herein or implemented using a combination of discrete low power op-amps, latches and comparators. The functions described in the schematic could also be implemented in a radiation hardened low power microcontroller, Application Specific Integrated Circuit (ASIC) or Field Programmable Gate Array (FPGA) configured to perform the functions of the power converter disclosed herein.

In one implementation the power supply module was tested to produce an output power of 1 W with an efficiency of at least 87%.

Figure 9A:
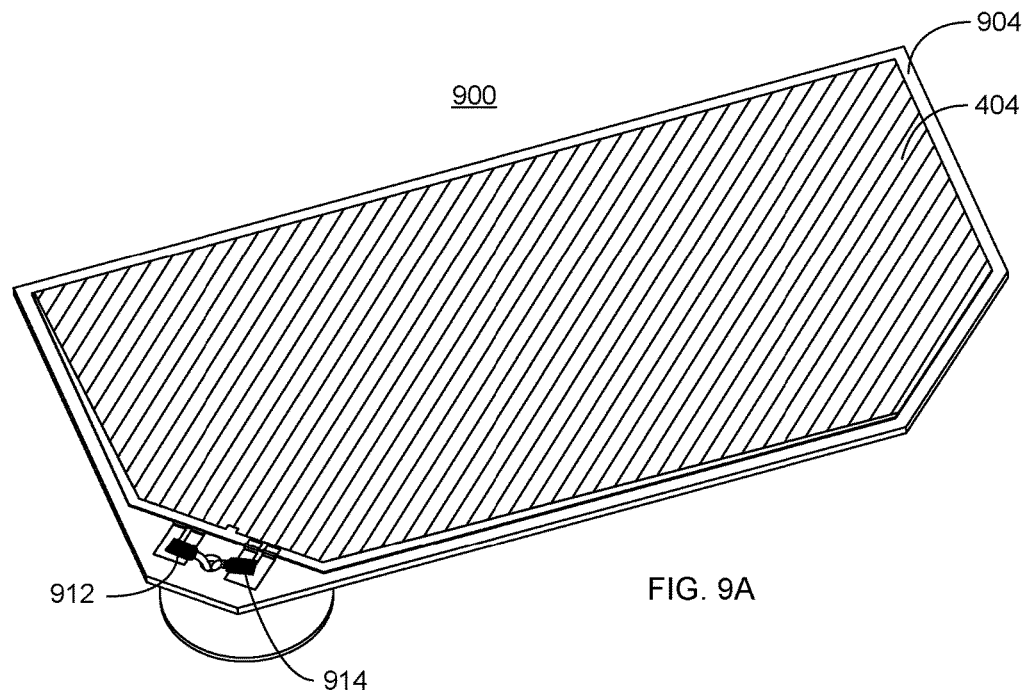
FIGS. 9A and 9B show respective top and bottom perspective views of a packaging of the power supply module according to an embodiment of the present matter.
Figure 9B:
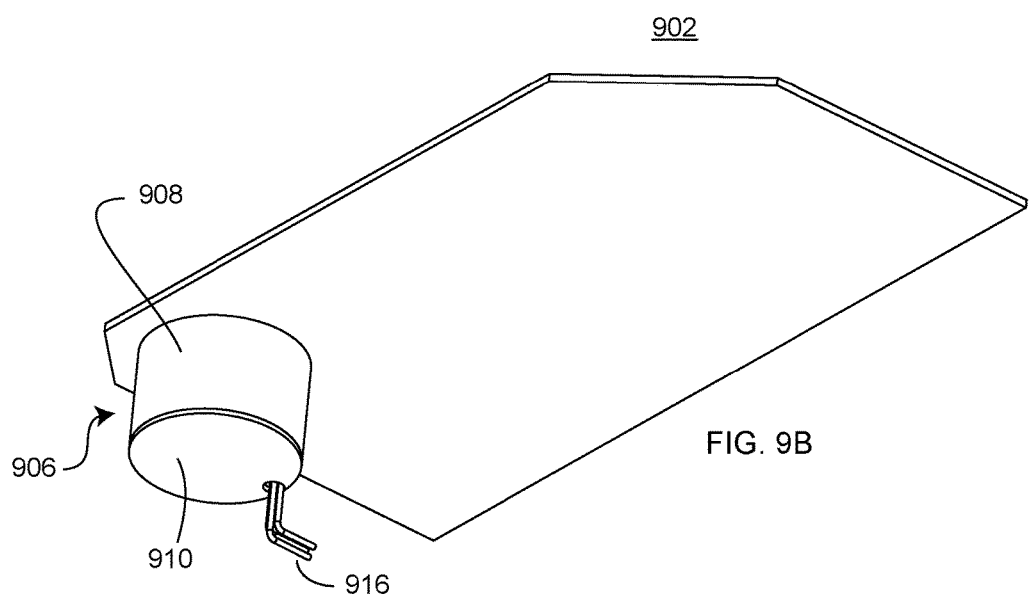

Packaging of the power supply module is comprised of electronic components mounted onto a printed circuit substrate, which in turn may be embedded into a body of a solar array substrate. In spacecraft applications for example, the packaged module must be capable of withstanding launch vibration and acoustic loads as well as repeated thermal cycles from −150° C. to +120° C. and high levels of radiation as experienced in space. Referring to FIGS. 9A and 9B, there is shown respectively a top view 900 and a bottom perspective view 902 of a physical layout of the power supply module 401 according to an embodiment of the present disclosure. The single solar cell 404 is mounted on one surface of a suitable mounting plate 904, such as carbon-fibre board, and the power converter is enclosed in a suitable container 906 and mounted on an opposite surface of the mounting plate 904. An example container 906 may be made of a carbon fiber tubular portion 908 enclosing the power converter electronics with a cylindrical endcap 910. Input connections are then made through the substrate to connect the solar cell +Ve 912 and −Ve 914 output to the power converter circuit. The power supply module output connections may be coupled by suitable leads 916 or connectors from the power converter output terminals and extending through an opening in the end cap 910. The output leads may consist of 3 wires being the positive and negative output power along with a power control line. The surface of the solar cell facing away from the mounting plate 904 is exposed to solar radiation.

As may be further appreciated due to the radiation levels in a spacecraft application, which must be tolerated by the power supply module, and specifically the circuit components of the power converter may be carefully chosen. For example, bipolar junction transistors were found to have inherent radiation tolerance. In another embodiment the power supply module is constructed of discrete components. In a further embodiment the discrete components are radiation hardened. In a still further embodiment, the circuit board and discrete components on which they are mounted are covered with a layer of insulating coating. Still further electrical connections between circuit components are made by welding and then subsequently coating with a layer of insulating coating. This coating may be applied using a variety of techniques, one of which includes vapour deposition.

Figure 10:
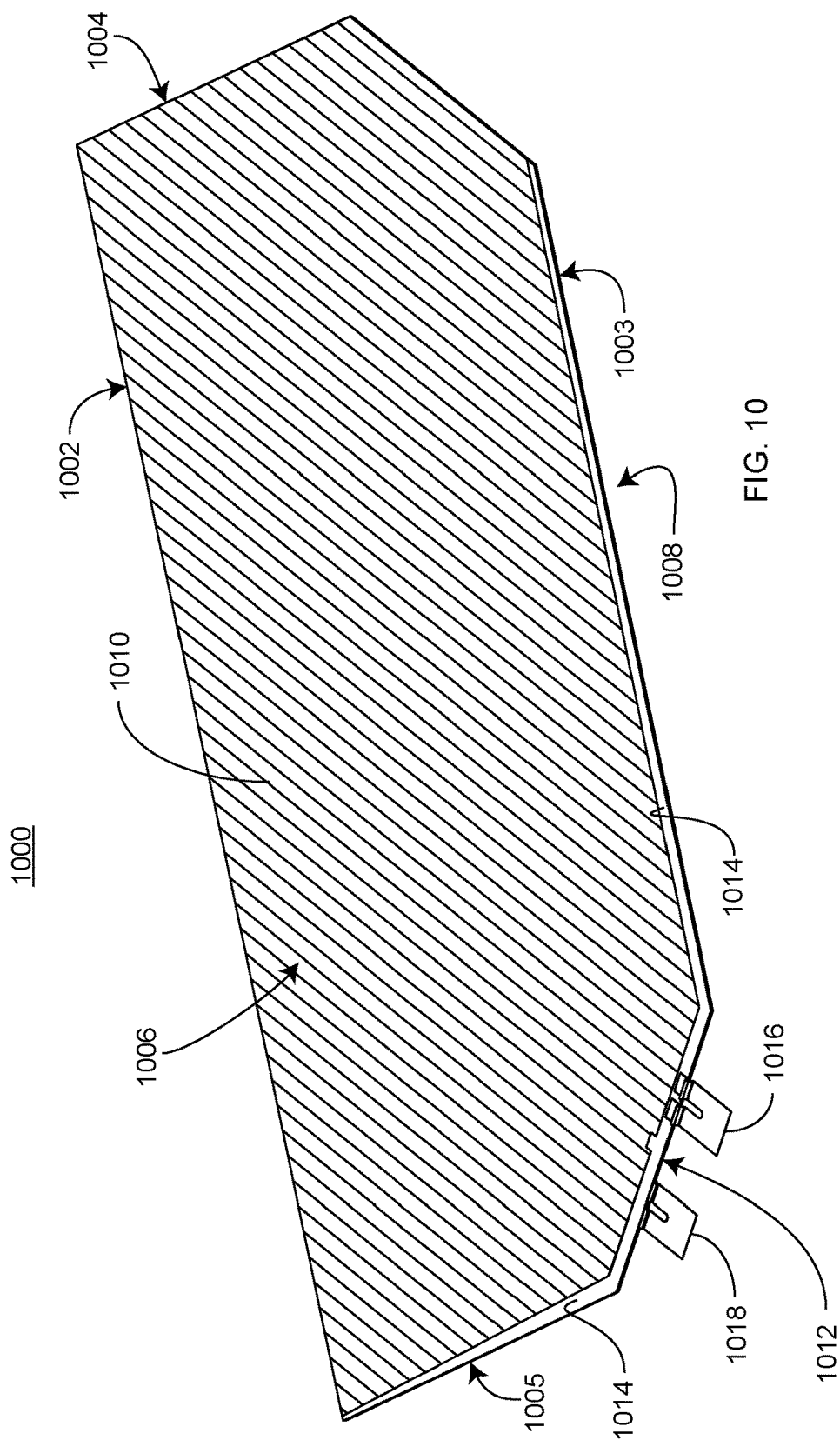
FIG. 10 shows a top perspective view of a solar cell according to an embodiment of the present matter.

Referring to FIG. 10 there is shown a solar cell 1000 according to an embodiment of the present disclosure. The solar cell 1000 is a generally rectangular shaped sheet, typically cut from a wafer die, having at least one clipped corner 1012, the perimeter of the rectangle is defined generally by a pair of opposing generally parallel major sides 1002, 1003 and a pair of opposing generally parallel minor sides 1004, 1005 joining the major sides 1002, 1003, a top surface 1006 and a generally parallel opposing bottom surface 1008, the sides abutting the top 1006 and bottom 1008 surfaces and to define edges of the generally rectangular perimeter of the top 1006 and bottom 1008 surfaces. The top 1006 surface includes a layer of parallel metallization lines 1010 extending from one major edge 1002 to the other edge 1003. In an embodiment the layer of parallel metallization lines formed on the top surface extends at an oblique angle from the one major edge to the other edge. A conductive channel 1014, is formed along minor side edge 1005 adjoining the clipped edge 1012 of the cell and is routed to the clipped edge 1012, a further conductive channel 1014 and then along the major edge 1003 and is also routed to the clipped side edge 1012 of the cell. This conductive channel is used to collect the currents from top layer metallization lines 1010 and transfer charge to a first interconnect tab 1016 located at the clipped edge. A second interconnect tab 1018 is connected to the bottom conductor of the cell and also located on the clipped edge adjacent the first interconnect tab 1016. The placement of the interconnect tabs along the clipped edge facilitates easier connection to the power converter input. In a further embodiment the parallel metallization lines 1010 may extend at an oblique angle from one major edge 1002 to the other edge 1003. In a further embodiment, a cover glass or film, not shown, may be used to cover the top surface 1006 to protect the solar cell from radiation.

Figure 11:
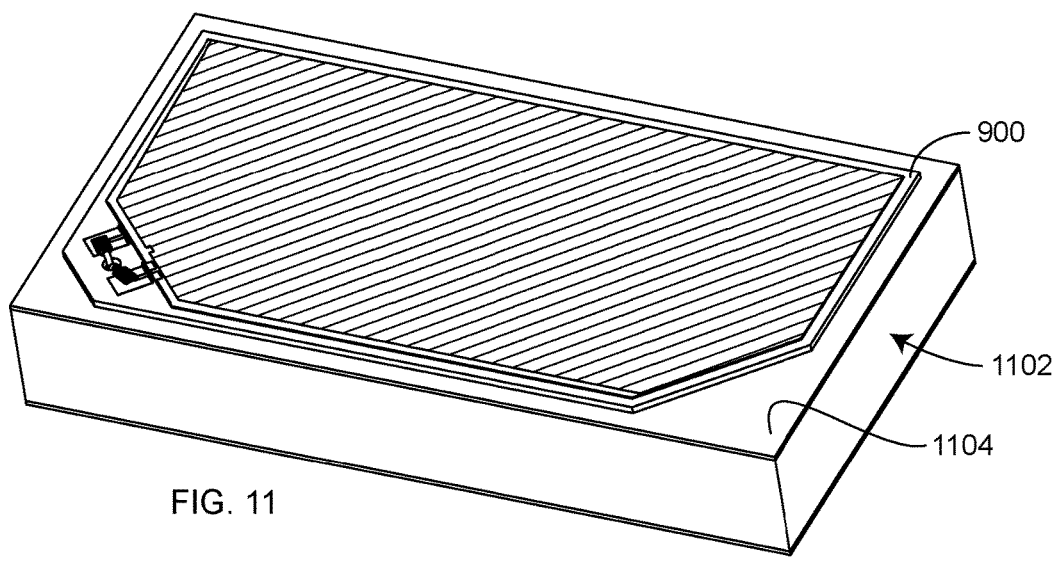
FIG. 11 shows a top perspective view the power supply module integrated into a top surface of a spacecraft panel according to an embodiment of the present matter.

Referring to FIG. 11 there is shown the power supply module 900 integrated into a top surface 1104 of a spacecraft solar panel 1102. Spacecraft solar panels are typically constructed using an aluminum honeycomb core with a carbon fiber or aluminum top and bottom skins. The panels 1102 are typically ½ inch thick.

Figure 12:
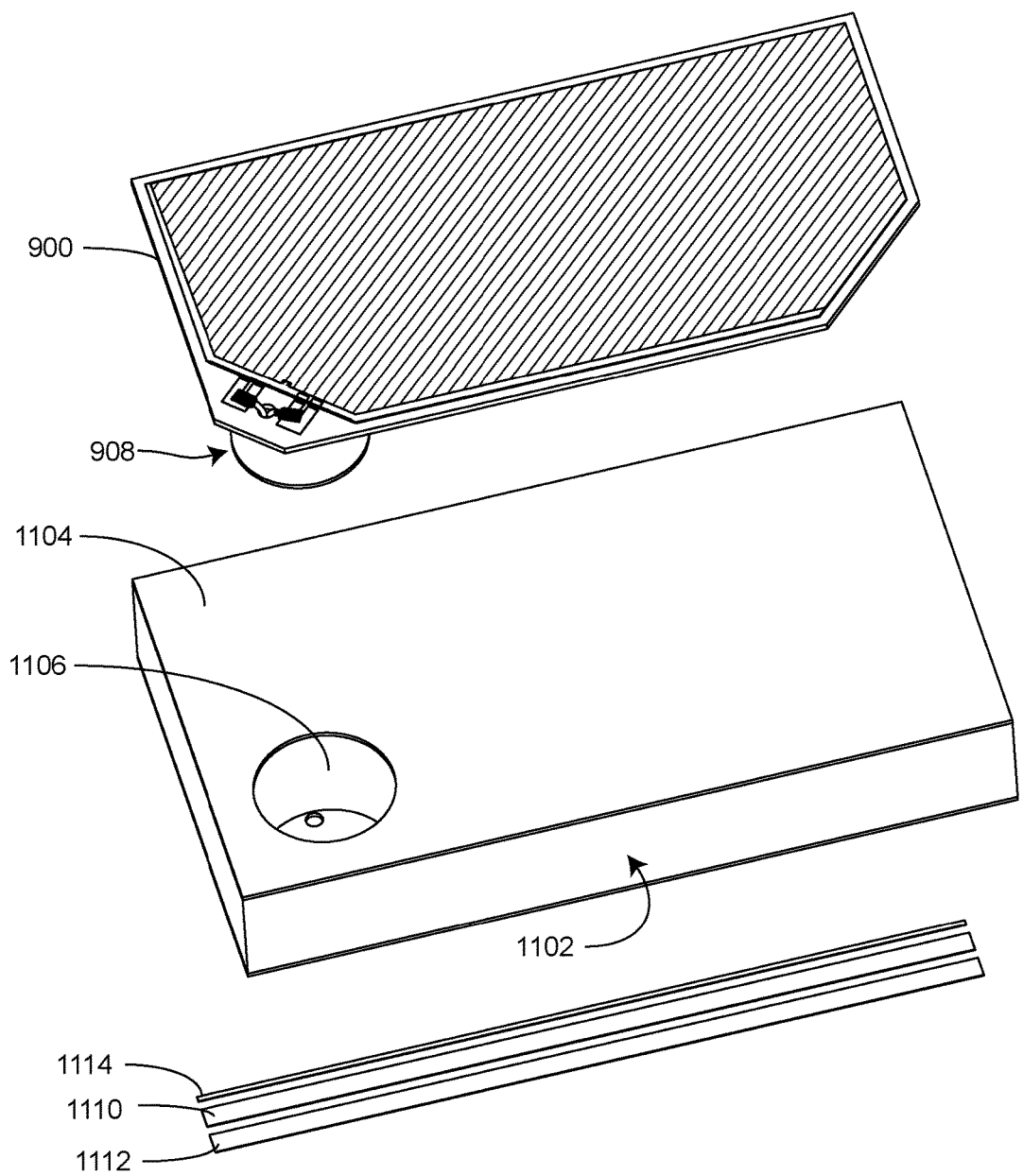
FIG. 12 shows an exploded view the spacecraft panel of FIG. 11.

The power supply module 900 is mounted onto the top surface 1104 of the panel 1102. An exploded view of the panel assembly is shown in FIG. 12. A cut-out 1106 is formed through the top surface of the panel 1104 in order to accommodate the container 908 for the power converter on the underside of the power supply module 900. The bottom surface of the power supply module 900, attaches to the top surface of the panel 1102.

Figure 13:
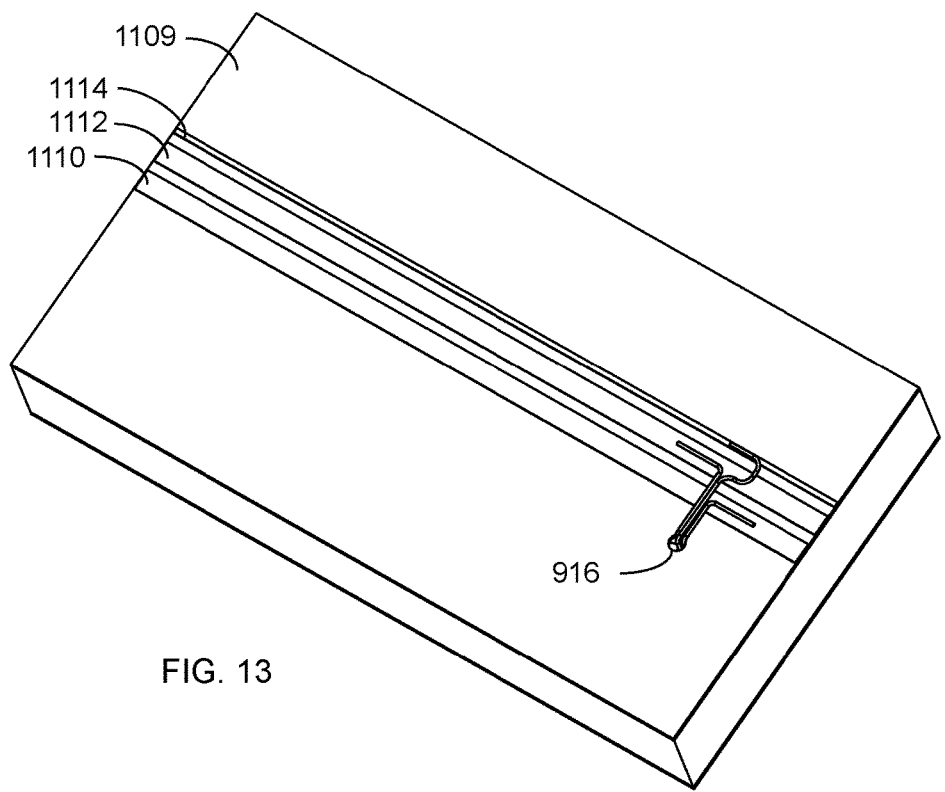
FIG. 13 shows a bottom perspective view the spacecraft panel of FIG. 11.

Referring to FIG. 13 there is shown the bottom surface 1109 of the solar panel 1102. The bottom surface of the solar panel 1102 may carry power bus conductors, 1110, 1112 and external control signal bus 1114. The output wires from the power supply module 900 exit from a small hole 916 in the bottom panel skin and connect to the corresponding bus bars.

Figure 15:
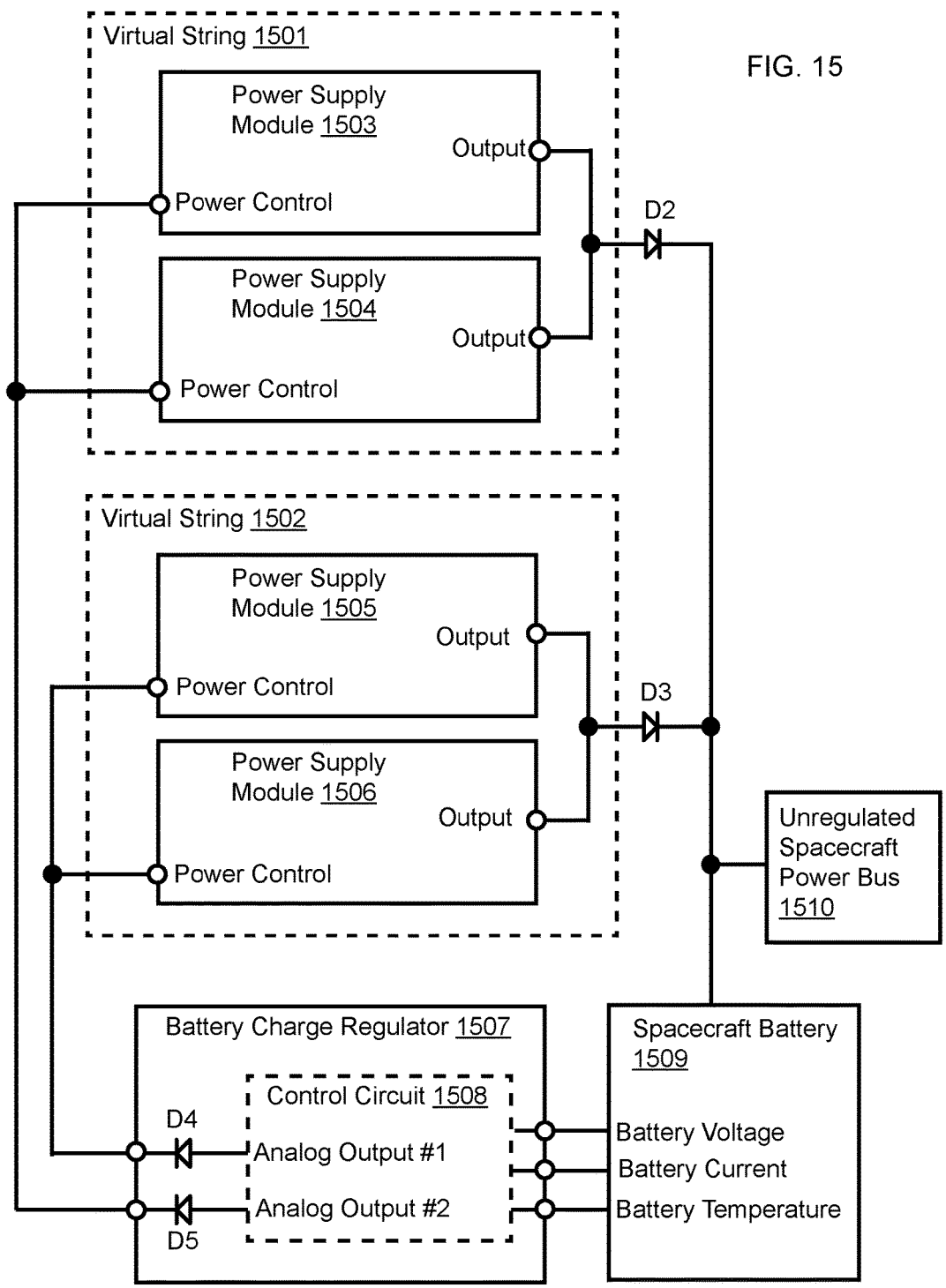
FIG. 15 shows a block diagram of a spacecraft distributed power subsystem using the power supply modules according to an embodiment of the present matter.

FIG. 14A and FIG. 14B show respective top and bottom perspective views of multiple modules 900a, 900b connected together. In a still further embodiment, the present disclosure provides a 1 W power supply module that may be configured in parallel with a plurality of other modules in order to provide power to a power subsystem. For example, FIG. 15 shows an arrangement of four (4) such power supply modules providing 4 w of power in a typical spacecraft power subsystem. The top two modules 1503 and 1504 have their outputs connected together. The combined output of the two power supply modules is then connected to the battery 1509 and unregulated spacecraft power bus 1510 through a diode D2. These power supply modules form a virtual string 1501 of parallel connected cells. Similarly, the bottom two Modules 1505, 1506 have their outputs connected together to form virtual string 1502. The function of diodes D2 and D3 is to isolate the virtual strings from each other so that any electrical or mechanical fault in a single virtual string will be limited to only that virtual string. To reduce losses these diodes could be implemented by an "ideal diode" using a MOSFET.

When charging the spacecraft battery, it is important to not exceed the battery maximum voltage limit and maximum charge current limit. To prevent an overvoltage condition on the battery, each power supply module limits its output voltage internally as was previously described where the module is shut down if the output voltage exceeds the internal reference limit.

The maximum charge current which the spacecraft battery can accept is dependent on the battery temperature and its state of charge. When the battery is cold, the charge current must be reduced to prevent damage to the battery. An external Battery Charge Regulator 1507 may be used to reduce the power generated by the modules by presenting a DC signal onto the power control lines of each Module. A control circuit 1508, within the battery charge regulator 1507, monitors the battery voltage, current and temperature. The output of the control circuit is a DC voltage which is used to control the power of each virtual string though the Module power control line. In FIG. 15 two independent control lines are shown, one for each virtual string. Diodes D4 and D5 are used to isolate the power control lines in virtual strings 1501 and 1502 in the event of an electrical or mechanical failure.

The structure, features, accessories, and alternatives of specific embodiments described herein and shown in the figures are intended to apply generally to all of the teachings of the present disclosure, including to all of the embodiments described and illustrated herein, insofar as they are compatible. In other words, the structure, features, accessories, and alternatives of a specific embodiment are not intended to be limited to only that specific embodiment unless so indicated.

Furthermore, additional features and advantages of the present disclosure will be appreciated by those skilled in the art. For example, the present embodiments are exemplified with respect to a solar cell as an example energy harvester transducer. The power converter of the subject disclosure may be used with other energy harvester transducers as mentioned herein. Furthermore, while the packaging of the power supply module is exemplified with a solar cell formed on one surface of a substrate and the power converter formed on an opposite surface other configurations of the power converter with respect to the solar cell may be contemplated. For example, the power converter may be spaced separate to the solar cell and connected thereto by suitable leads.

In addition, the embodiments described herein are examples of structures, systems or methods having elements corresponding to elements of the techniques of this application. This written description may enable those skilled in the art to make and use embodiments having alternative elements that likewise correspond to the elements of the techniques of this application. The intended scope of the techniques of this application thus includes other structures, systems or methods that do not differ from the techniques of this application as described herein, and further includes other structures, systems or methods with insubstantial differences from the techniques of this application as described herein.

Moreover, the previous detailed description is provided to enable any person skilled in the art to make or use the present invention. Various modifications to those embodiments will be readily apparent to those skilled in the art, and the generic principles defined herein may be applied to other embodiments without departing from the spirit or scope of the invention described herein. Thus, the present invention is not intended to be limited to the embodiments shown herein, but is to be accorded the full scope consistent with the claims, wherein reference to an element in the singular, such as by use of the article "a" or "an" is not intended to mean "one and only one" unless specifically so stated, but rather "one or more". All structural and functional equivalents to the elements of the various embodiments described throughout the disclosure that are known or later come to be known to those of ordinary skill in the art are intended to be encompassed by the elements of the claims. Moreover, nothing disclosed herein is intended to be dedicated to the public regardless of whether such disclosure is explicitly recited in the claims.

Furthermore, nothing herein is intended as an admission of prior art or of common general knowledge. Citation or identification of any document in this application is not an admission that such document is available as prior art, or that any reference forms a part of the common general knowledge in the art.

What is claimed is:

1. A power supply module for providing power to an unregulated spacecraft electrical power bus, the power supply module comprising:
   a solar cell;
   output terminals; and
   a power converter mounted to the solar cell, the power converter providing converted power from the solar cell to the output terminal having a DC output voltage determined by a voltage of the unregulated spacecraft electrical power bus, wherein the power converter includes a peak power tracking circuit to continuously extract power from the solar cell at its maximum power point and wherein the peak power tracking circuit includes: a charge storage element; and a ripple voltage generation circuit for generating a voltage ripple on the charge storage element, an upper and lower limit of the ripple voltage being set by voltage references in the peak power tracking circuit, the voltage ripple determining a switching frequency of the power converter.

2. The power supply of claim 1, wherein the power supply module further includes at most a single set of electrical leads connected to the output terminals, the set of electrical leads composed of no more than a pair of output power leads, and control leads, the output power leads for connecting the output terminals to the unregulated electrical power bus.

3. The power supply of claim 1, further including a carrier plate and the single solar cell mounted to one surface of the carrier plate.

4. The power supply of claim 3, the output terminals being located at one edge of the carrier plate.

5. The power supply of claim 1, wherein the voltage ripple is determined in part by a peak power point voltage reference set to a voltage of the peak power point of the single solar cell.

6. The power supply of claim 1, wherein the power converter includes an output filter to provide a DC voltage at the output terminals.

7. The power supply of claim 1, the power converter including an output limiting circuit to limit a peak voltage output at the output terminals by generating a feedback control signal to limit the output of the power converter.

8. The power supply of claim 1, the power converter including external power control input for receiving an external power control signal to change the output power from the converter.

9. The power supply of claim 5, wherein the peak power point voltage reference includes a temperature compensation element to compensate for changes in the maximum power point voltage due to temperature effects on the single solar cell.

10. The power supply of claim 1, wherein each power supply module is mounted on a top surface of a spacecraft panel.

11. The power supply of claim 1, wherein the power converter of each power supply module is mounted in respective recesses of the spacecraft panel.

12. The power supply of claim 1, wherein the power bus is formed on a bottom surface opposite the top surface of the spacecraft panel and each power supply module is connected by no more than a pair of output power leads to the power bus.

13. The power supply of claim 1, including a plurality of power supply modules connected in series or in parallel.

14. The power supply of claim 1, wherein the solar cell comprises:
   generally rectangular shape having at least one clipped corner the perimeter of the rectangle being defined generally by a pair of opposing generally parallel major sides and a pair of opposing generally parallel minor sides joining the major sides; a top surface;
   a generally parallel opposing bottom surface, the sides abutting the top and bottom surfaces defining edges of the generally rectangular perimeter of the top and bottom surfaces; and a layer of parallel metallization lines formed on the top surface extending at an oblique angle from one major edge to the other edge.

15. The power supply of claim 14 wherein output contacts of the solar cell are located along said clipped corner.

16. The power supply of claim 1, wherein the voltage ripple is determined in part by a peak power point voltage reference set to a voltage of the peak power point of the solar cell.

17. The power supply of claim 1, the power converter including an output limiting circuit to limit a peak voltage output at the output terminals by generating a feedback control signal to limit the output of the power converter.

18. The power supply of claim 1, the power converter including external power control input for receiving an external power control signal to change the output power from the converter.

19. The power supply of claim 16, wherein the peak power point voltage reference includes a temperature compensation element to compensate for changes in the maximum power point voltage due to temperature effects on the single solar cell.

\* \* \* \* \*